(12) United States Patent
Liu et al.

(10) Patent No.: US 11,409,446 B2
(45) Date of Patent: Aug. 9, 2022

(54) MEDIA MANAGEMENT ON POWER-UP

(71) Applicant: Micron Technology, Inc., Boise, ID (US)

(72) Inventors: Tao Liu, San Jose, CA (US); Xiangang Luo, Fremont, CA (US)

(73) Assignee: Micro Technology, Inc., Boise, ID (US)

( * ) Notice: Subject to any disclaimer, the term of this patent is extended or adjusted under 35 U.S.C. 154(b) by 0 days.

(21) Appl. No.: 17/095,386

(22) Filed: Nov. 11, 2020

(65) Prior Publication Data

US 2022/0147252 A1    May 12, 2022

(51) Int. Cl.
*G06F 3/06* (2006.01)
(52) U.S. Cl.
CPC .......... *G06F 3/0625* (2013.01); *G06F 3/0604* (2013.01); *G06F 3/0652* (2013.01); *G06F 3/0679* (2013.01)
(58) Field of Classification Search
CPC .... G06F 3/0625; G06F 3/0604; G06F 3/0652; G06F 12/0246
See application file for complete search history.

(56) References Cited

U.S. PATENT DOCUMENTS

| | | | |
|---|---|---|---|
| 8,352,683 B2 | 1/2013 | Cohen et al. | |
| 9,691,485 B1 * | 6/2017 | Kumar | G11C 16/105 |
| 9,727,249 B1 * | 8/2017 | Subramanian | G11C 16/10 |
| 10,818,371 B2 | 10/2020 | Lin | |

| | | |
|---|---|---|
| 2012/0226924 A1 | 9/2012 | Rajan et al. |
| 2014/0231954 A1 | 8/2014 | Lue |
| 2016/0179386 A1 | 6/2016 | Zhang |

(Continued)

FOREIGN PATENT DOCUMENTS

| | | |
|---|---|---|
| CN | 110874187 | 3/2020 |
| KR | 101456860 | 11/2014 |
| WO | 2017074570 A1 | 5/2017 |

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

(Continued)

*Primary Examiner* — Edward J Dudek, Jr.
(74) *Attorney, Agent, or Firm* — Brooks, Cameron & Huebsch, PLLC

(57) ABSTRACT

A method includes detecting a power-up event associated with a memory sub-system comprising a plurality of blocks of memory cells having blocks of memory cells associated therewith, responsive to detecting the power-up event and prior to receipt of signaling indicative of a host initiation sequence, determining that a block of memory cells associated with a respective block among the plurality of blocks of memory cells is an open virtual block of memory cells, determining that the respective block associated with the open virtual block of memory cells exhibits greater than a threshold health characteristic value, and selectively performing a media management operation of a respective block of memory cells associated with the open virtual block of memory cells in response to the determination that the respective block exhibits greater than the threshold health characteristic value.

20 Claims, 5 Drawing Sheets

(56) References Cited

U.S. PATENT DOCUMENTS

| | | |
|---|---|---|
| 2018/0004417 A1* | 1/2018 | Park .................. G11C 16/26 |
| 2018/0165198 A1* | 6/2018 | Liu .................. G06F 12/0815 |
| 2020/0089435 A1 | 3/2020 | Dubeyko et al. |
| 2020/0301849 A1 | 9/2020 | Blagodurov et al. |

OTHER PUBLICATIONS

International Search Report and Written Opinion from related PCT Application No. PCT/US2021/055973, dated Feb. 8, 2022, 8 pages.

\* cited by examiner

MEDIA MANAGEMENT ON POWER-UP

TECHNICAL FIELD

Embodiments of the disclosure relate generally to memory sub-systems, and more specifically, relate to media management on power-up.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
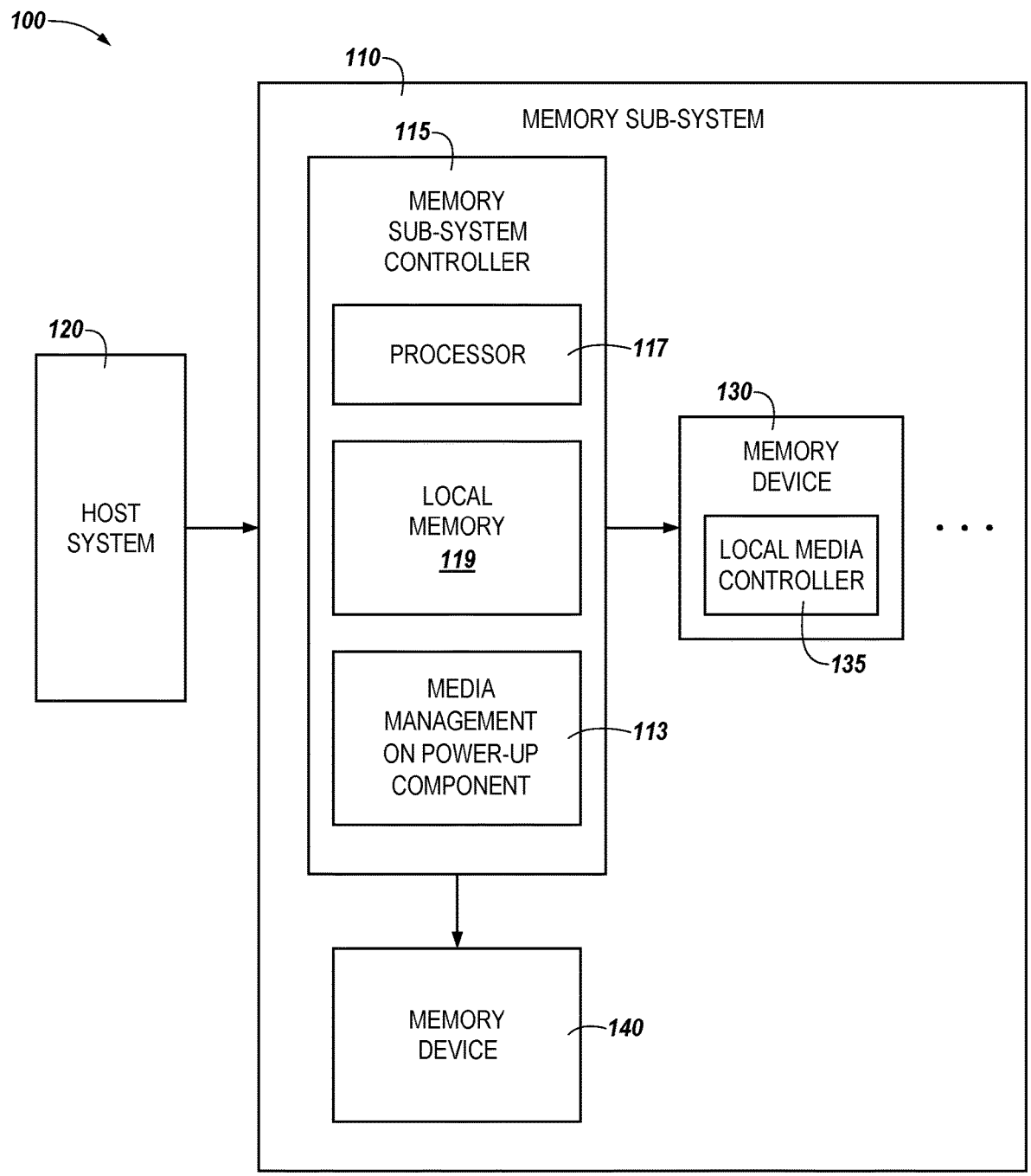
FIG. 1 illustrates an example computing system that includes a memory sub-system in accordance with some embodiments of the present disclosure.

Aspects of the present disclosure are directed to media management on power-up, in particular to memory sub-systems that include a media management on power-up component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Memory cells such as those in an upper page or lower page, as detailed herein, of a memory block can be programmed to a target (e.g., desired) data state. For instance, an electric charge can be placed on or removed from a charge storage structure (e.g., transistors or "gates" associated with a memory structure, which can include floating gate and/or replacement gate architectures) of a memory cell to program the memory cell to a particular data state. For example, a charge can be applied to a program a lower page to a target data state. A subsequent charge can be applied to program an upper page to a target data state. However, time can elapse between programming of the lower page and the upper page. Thus, an open memory block (i.e., a partially programmed memory block) can be formed. As used herein, the term "open block" (e.g., an open virtual block, physical block, and/or logical block) generally refers to a memory block where some, but not all, of the pages of the memory block are programmed.

Further, as used herein, the terms "virtual block," "physical block" and "logical block" generally refer to various characterizations of memory blocks that can be categorized by a physical location where such memory blocks are stored within a memory sub-system or a logical location in which addresses corresponding to the physical location(s) where such memory blocks are stored with the memory sub-system. For example, a "physical block" generally refers to a set of memory cells that store charges corresponding to data values. A physical block has an address (e.g., a physical block address) associated therewith. A "logical block" generally refers to a data structure that contains logical address information (e.g., a logical block address) corresponding to the physical addresses of memory locations withing a physical block. A "virtual block" generally refers to one or more constituent portions of a logical block address. For example, a virtual block can contain a portion of the logical block address and/or information corresponding to a logical offset associated with a logical block (or logical block address). In some embodiments, the portion of the logical address associated with a virtual block can contain the most significant bits of the logical block address and the offset information can contain the least significant bits of the logical block address.

Due to characteristics inherent in NAND memory devices, data quality can degrade over time. For instance, as a program-erase cycle (PEC) count of a block of memory cells (which can be referred to herein for simplicity as a "block") increases, data quality in the block can decrease. Degradation of data quality can render memory cells prone to failures. For instance, over time a threshold voltage ($V_T$) level shift can occur. As a result of the $V_T$ level shift, a read operation performed on a memory cell experiencing the $V_T$ level shift can fail or return a corrupted or incorrect data value.

To mitigate these issues, some approaches attempt periodic randomized selection of blocks (e.g., virtual blocks) in an effort to mitigate data degradation. For instance, such approaches can employ periodic randomized selection of a block (e.g., selection of a virtual block), and then perform a scan operation of and subsequent block refresh of a physical and/or logical block associated with the randomly selected virtual block. Such scans and/or block refreshes can be performed in the background (i.e., during idle time of a host). However, random selection of virtual blocks can lead to repeated selection and scanning of a given virtual block multiple times before another virtual block is selected and scanned. As a result, an unselected virtual block will not be refreshed, and thus data in the unselected virtual block will continue to degrade.

Moreover, it has been discovered that an open block can be prone to errors. For instance, an open block can be particularly prone to errors when the open block exhibits greater than a threshold health characteristic value and/or after a power-off event associated with a memory sub-system which includes the open block. For example, an open block can be prone to errors subsequent to an extended power-off event and/or Asynchronous Power Loss (APL). As used herein, an APL refers to a sudden and unexpected power loss that is not preceded by a shutdown notification from the host.

For instance, an open block can be prone to a misplacement error. As used herein, a "misplacement error" generally refers to the occurrence of a failed/inaccurate read operation involving a memory cell of a page that causes a subsequent misplacement of data. For example, a misplacement error can occur subsequent to data being programmed to the lowest page in a block, but not programming data to other pages in the block (i.e., subsequent to formation of an open block). In such examples, additional data can be programmed to the open block. For instance, the highest page and/or extra pages of a page associated of the memory block associated with the open virtual block can be programmed to form a full block (e.g., a full virtual block, full physical block, and/or full logical block). As used herein, a "full block" generally refers to a block where all of the pages are programmed (e.g., include data). However, due to the now full block exhibiting greater than a threshold health characteristic value and/or the block having experienced a power-off event, such as an unexpected power-off event, a subsequent read operation to data in the pages of the block can fail (e.g., cause a non-recoverable failure).

As such, the disclosure is directed to media management on power-up of a memory sub-system and/or a computing system. Notably, such media management can be performed responsive to detecting a power-up event associated with a memory sub-system, rather than occurring during idle time of a host. As such, media management operations (e.g., media scan operations and any subsequent block refresh operations performed) can be performed prior to any host activity (e.g., prior to the host utilizing an interface associated with the memory sub-system). By so doing, open blocks that exhibit greater than a threshold health characteristic value and/or having experienced a power-off event are precluded from being programmed by the host, and thus are precluded from becoming full blocks prior to being scanned (and when necessary refreshed). Stated differently, media management operations (e.g., media scans and any subsequent block refresh operations performed) can be performed prior to the host performing initializing operations that involve the memory system. Consequently, misplacement errors can be prevented for occurring. An example of a media scan operation is a background media scan operation that can be performed to determine whether or not to perform a media management operation on more or more portions of a memory sub-system.

Conversely, with other approaches that do not preclude open blocks (e.g., open virtual blocks) from being programmed by the host when the open block exhibits greater than a threshold health characteristic value and/or experiences a power-off event, the memory sub-system can experience degraded performance. This degradation of performance can be undesirable, especially in critical applications and/or in applications in demanding applications in which very high memory sub-system performance is expected. Further, this degraded performance that can be exhibited in such approaches can be further exacerbated in mobile (e.g., smartphone, internet of things, etc.) memory deployments in which an amount of space available to house a memory sub-system is limited in comparison to traditional computing architectures.

Aspects of the present disclosure address the above and other deficiencies by detecting a power-up event associated with a memory sub-system and, responsive to detecting the power-up event but prior to receipt of signaling indicative of a host initiation sequence and/or prior to completion of the host initialization sequence, determining that a block is an open block, and selectively performing a media management operation on the open block. In some embodiments, selectively performing the media management operation can occur in response to a determination that the open block exhibits greater than a threshold health characteristic value. Additionally, in some embodiments, based on performing a media management operation on the open block, a block refresh can be performed on the open block.

As used herein, a "host initialization sequence" generally refers to various processes that are performed by central processing unit (CPU) of a host computing device in conjunction with other components that are deployed within the host computing device in response to a computing system receiving a power signal. Examples of processes that can be performed by the host computing device during an initialization sequence can include receipt of clock signals generated by the system clock and received by the CPU. In response to receipt of such timing signals, the host initialization sequence can further include locating, by the CPU, system level read-only memory (ROM) basic input/output system (BIOS) instructions to cause the computing system to begin a start-up sequence to allow the computing system to operate. The ROM BIOS instruction can cause the CPU to execute an instruction stored in a predetermined ROM location to perform a power-on self-test (POST) operation to check the status of various components of the computing system such as memory sub-systems, memory devices, power supplies, ports, peripheral devices (e.g., pointing devices, keyboards, etc.), video cards, etc. Upon successful completion of the POST, the CPU generally accesses the BIOS to locate an operating system (OS) to execute and performs operations to execute the OS to allow user access to applications executable by the host computing device.

Although some embodiments herein are generally described with respect to performing media management operations prior to receipt of signaling indicative of a host initiation sequence, embodiments of the present disclosure are not so limited. For example, in some embodiments, the operations performed herein (e.g., the media management operations described herein) can be performed at different stages of the host initialization sequence, as appropriate. For example, in at least one embodiment, aspects of the disclosure can be performed in response to receipt of signaling indicative of a POST operation by a memory sub-system and/or memory device, but prior to completion of the host initialization sequence. Further, in some embodiments, media management operations described herein can be performed subsequent to successful performance of the POST operation but prior to initialization of the OS.

By performing aspects of media management on power-up, as detailed herein, memory sub-system performance can be improved in comparison to approaches such as those which randomly select blocks (e.g., virtual blocks) and perform media management operations and any subsequent block refreshes in the background. For instance, by performing aspects of media management on power-up, as detailed herein, misplacement errors can be prevented. Embodiments herein can be applied in mobile memory deployments to further improve the reliability of a memory sub-system deployed in a mobile computing architecture.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM),ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a media management on power-up component 113. Although not shown in FIG. 1 so as to not obfuscate the drawings, the media management on power-up component 113 can include various circuitry to facilitate detecting a power-up event associated with a memory sub-system comprising a plurality of blocks of memory cells having virtual blocks associated therewith, responsive to detecting the power-up event and prior to receipt of signaling indicative of a host initiation sequence, determining that a block (e.g., a virtual block, physical block, and/or a logical block) is an open block, and selectively performing a media management operation of a respective block associated with the open block. In some embodiments, the media management on power-up component 113 can include special purpose circuitry in the form of an ASIC, FPGA, state machine, and/or other logic circuitry that can allow the media management on power-up component 113 to orchestrate and/or perform the operations described herein.

In some embodiments, the memory sub-system controller 115 includes at least a portion of the media management on power-up component 113. For example, the memory sub-system controller 115 can include a processor 117 (processing device) configured to execute instructions stored in local memory 119 for performing the operations described herein. In some embodiments, the media management on power-up component 113 is part of the memory sub-system 110, an application, or an operating system.

In a non-limiting example, an apparatus (e.g., the computing system 100) can include a media management on power-up component 113. The media management on power-up component 113 can be resident on the memory sub-system 110. As used herein, the term "resident on"

refers to something that is physically located on a particular component. For example, the media management on power-up component 113 being "resident on" the memory sub-system 110 refers to a condition in which the hardware circuitry that comprises the media management on power-up component 113 is physically located on the memory sub-system 110. The term "resident on" can be used interchangeably with other terms such as "deployed on" or "located on," herein.

The media management on power-up component 113 can be configured to detect a power-up event associated with a memory sub-system comprising a plurality of blocks of memory cells (e.g., blocks of NAND memory cells). A power-up event can be detected based on a change in an indicator/flag or other mechanism and/or based on a change in a voltage/current detected by a memory sub-system 110 and/or a memory device 130/140, among other possibilities. In some embodiments, the power-up event can be detected by components of the memory sub-system 110 prior to and/or in the absence of receipt of memory sub-system initiation commands originating from a central processing unit of the host system 120. Accordingly, in some embodiments, the power-up event can be detected by components of the memory sub-system 110 before the host system 120 propagates signals or asserts commands on the memory sub-system 110 that invoke memory cells of the memory device 130/140. This can allow for the memory sub-system 110 to perform the operations described herein.

As described above, the memory components can be memory dice or memory packages that form at least a portion of the memory device 130. In some embodiments, the blocks of memory cells can form one or more "superblocks." As used herein, a "superblock" generally refers to a set of data blocks that span multiple memory dice and are written in an interleaved fashion. For instance, in some embodiments each of a number of interleaved NAND memory blocks can be deployed across multiple memory dice that have multiple planes and/or pages associated therewith. The terms "superblock," "block," "block of memory cells," and/or "interleaved NAND memory blocks," as well as variants thereof, can, given the context of the disclosure, be used interchangeably.

In some embodiments, the media management on power-up component 113 can be further configured to determine that a block is an open block. In some embodiments, whether the block is an open block can be determined by determining that a lower page of the block is programmed and an upper page of the block is an open page (i.e., a page that is not programmed). Determination of whether a page is an open page or not can occur based on application of a voltage (e.g., a read voltage) to a memory cell in the page. Depending on a returned value/voltage, the page can be determined to be an open page or a programmed page. Notably, determination whether the block is an open block can occur responsive to detecting the power-up event, rather than in the background/ during idle time. For instance, such determinations can occur responsive to detecting the power-up event and prior to receipt of signaling indicative of a host initiation sequence.

The media management on power-up component 113 can be further configured to determine that the open block exhibits greater than a threshold health characteristic value. For instance, the media management on power-up component 113 can determine that a respective block (e.g., a physical block and/or logical block) associated with an open virtual block exhibits greater than a threshold health characteristic value. As used herein, "health characteristics" generally refer to quantifiable attributes of memory cells in a memory block that correspond to the quality, life expectancy, or other attributes of the memory cells that can affect the ability of the memory cells to accurately store data. Non-limiting examples of health characteristics or health metrics can include a raw bit error rate (RBER) associated with the memory cells, wear leveling characteristics associated with the memory cells, and/or a total quantity of program erase cycles the memory cells have been subjected to, among others. As such, various scans such as a background scan, a RBER scan, a read scan, and/or an integrity scan can be employed to determine a given heath characteristic value. For instance, determination of the health characteristic value can include determination of at least one of a program-erase cycle (PEC) count, an erase count, an age, or any combination thereof, of a block (e.g., respective block associated with the open virtual block).

The media management on power-up component 113 can be further configured to selectively perform a media management operation on a block (e.g., on a respective block associated with the open virtual block). Selectively performing the media management operation can occur in response to the determination that the block (e.g., the respective block associated with the open virtual block) exhibits greater than the threshold health characteristic value.

In some embodiments, the media management on power-up component 113 can be further configured to perform a block refresh of data stored in a block. The block refresh can be performed based on performance of the media management operation on the block. Notably, the media management on power-up component 113 can be further configured to perform the block refresh prior to performing (or permitting) any host accesses of the block (e.g., the respective block associated with the open virtual block). As mentioned, precluding such host access in conjunction with other aspects (e.g., performing the block refresh prior to performing any host accesses of the block) of media management on power-up can prevent errors such as misplacement errors.

Figure 2:
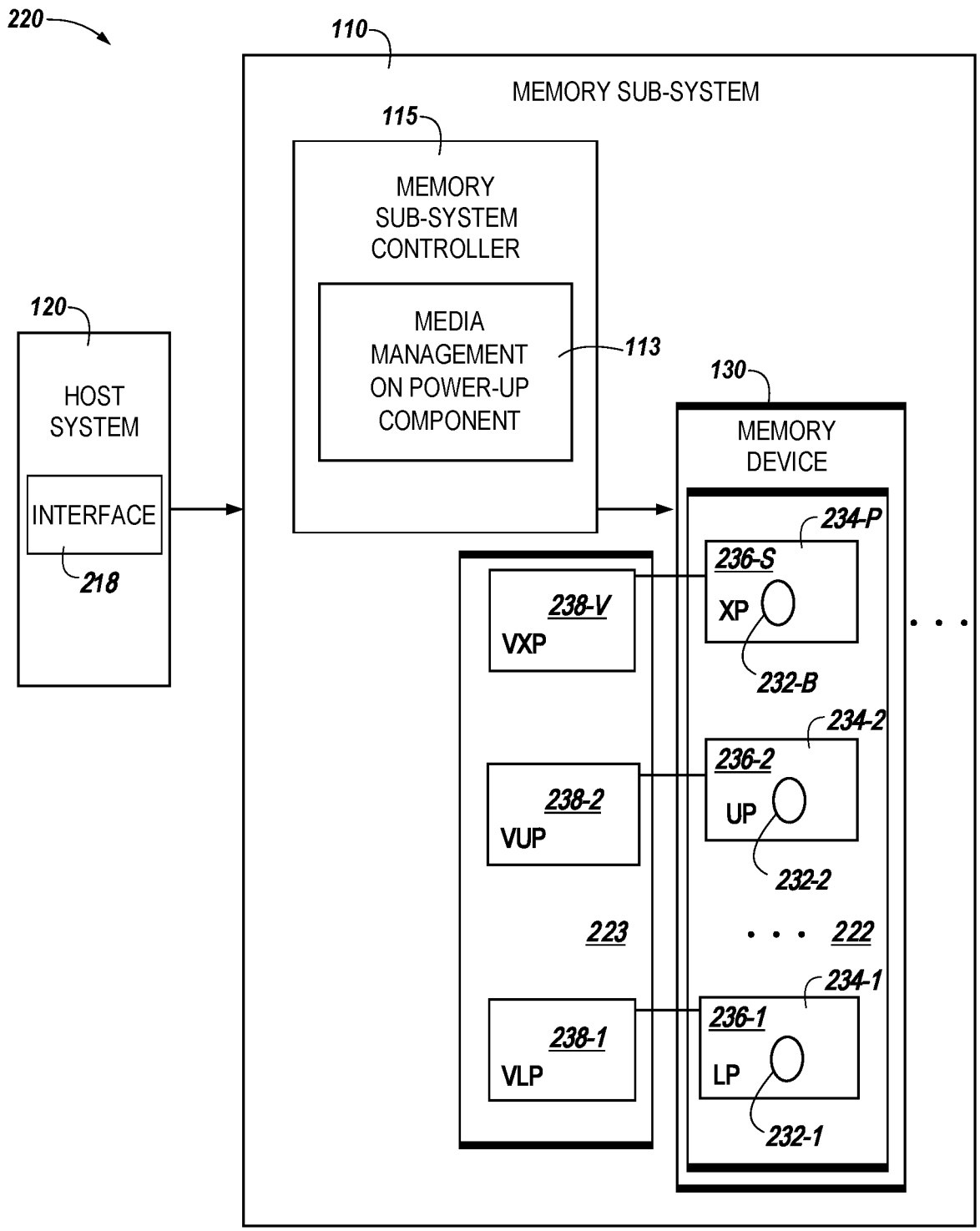
FIG. 2 illustrates an example computing system that includes a memory sub-system having blocks of memory cells in accordance with some embodiments of the present disclosure.

FIG. 2 illustrates an example computing system that includes a memory sub-system having blocks of memory cells in accordance with some embodiments of the present disclosure. As mentioned, the memory sub-system 110 can include media, such as one or more volatile memory devices (e.g., memory device 140), one or more non-volatile memory devices (e.g., memory device 130), or a combination of such.

As mentioned, the memory device 140 can include pages of memory cells. The memory cells (that can be referred to in the interest of brevity as "cells") are programmable to a plurality of different data states (that can be referred to in the interest of brevity as "states") such a first data state (as represented by 236-1), a second data state 236-2, and a third data state 236-S (hereinafter generally referred to as states 236). The states 236 correspond to respective threshold voltage ($V_T$) levels to which cells can be programmed and are represented by respective $V_T$ distributions, which can reflect statistical average $V_T$ levels of cells programmed to a particular one of multiple states 236.

As shown in FIG. 2, the states 236 can be encoded with respective bits of stored data patterns as represented by 232-1, 232-2, and 232-B (hereinafter generally referred to as data patterns 232). For instance, adjacent data patterns of the data patterns 232 can differ by a single bit, among other possibilities.

In some embodiments, the bits of stored data patterns 232 correspond to different respective logical pages of data. For instance, in this example, the least significant bit (LSB) (not illustrated) of the data patterns 232 corresponds to a first logical page 234-1, which can be referred to as a "lower page" (LP). The next bit (not illustrated) of the data patterns 232 corresponds to a second logical page 234-2, which can be referred to as an "upper page" (UP). In addition, the most significant bit (MSB) (not illustrated) of the data patterns 232 correspond to a third logical page 234-P, which can be referred to as an "extra page" (XP). While illustrated as a particular total number of pages it is understood that a different number of pages can be present. Moreover, while described herein with respect to a logical block 222, a person of ordinary skill appreciates that the logical block 222 (e.g., an open logical block) and the logical pages 234 can be associated with a virtual block (represented by 223) and a plurality of virtual pages (represented by 238-1, 238-2, . . . , 238-V). Thus, the virtual block 223 can be an open virtual block, for instance, having a lower virtual page 238-1 (VLP) which is programmed, but at least another page (e.g., an upper virtual page 238-2 (VUP) and/or an extra virtual page 238-V(VXP)) which is not programmed.

In some embodiments, state 236-1 can correspond to a lowermost $V_T$ level of states 236 and state 236-S can correspond to an uppermost $V_T$ level of states 236, among other possibilities. The memory cells can be programmed in accordance with various techniques. As an example, a one-pass programming can be employed in which cells coupled to a selected word line are each programmed from the erase state directly to one of the target states 236.

Alternatively, the cells can be programmed via a multiple pass programming technique (e.g., two-pass, three-pass, etc.) that can include increasing the $V_T$ levels of at least some of the cells to one or more intermediate $V_T$ levels (e.g., below the $V_T$ level corresponding to the target state 236) via a first programming pass, and then subsequently increasing cell $V_T$ levels from the one or more intermediate $V_T$ levels to the target $V_T$ level via one or more subsequent programming passes. For instance, a first pass can program the first logical page 234-1 (the lower page (LP)) to a particular data state, but may not program another logical page such as the second logical page 234-2 (i.e., the upper page (UP)) and/or the third logical page 234-P (the extra page (XP). As a result, a block 222 including the first logical page 234-1 is partially programmed. However, the second logical page 234-2 (i.e., an "upper page" (UP)) and/or the third logical page 234-P remain open. In such an instance, an open block is formed.

However, as mentioned, an open block can be prone to errors such as misplacement errors, particularly when exhibiting greater than a threshold health characteristic value and/or after a power-off event or unexpected power failure. For instance, the host system 120 can, via a physical host interface 218 such as a NVMe interface or other type of interface, program additional pages of the open block, and thus eventually fill the open block until formation of a full block. However, permitting the host system 120 continued access via the physical host interface 218 to the open block when the open virtual block of memory cells exhibits greater than a threshold health characteristic value and/or after a power-off event associated with a memory sub-system, can make the open block (e.g., once closed) prone to errors, as detailed herein. Accordingly, media management on power-up, as detailed herein, can be employed to mitigate such errors.

Figure 3:
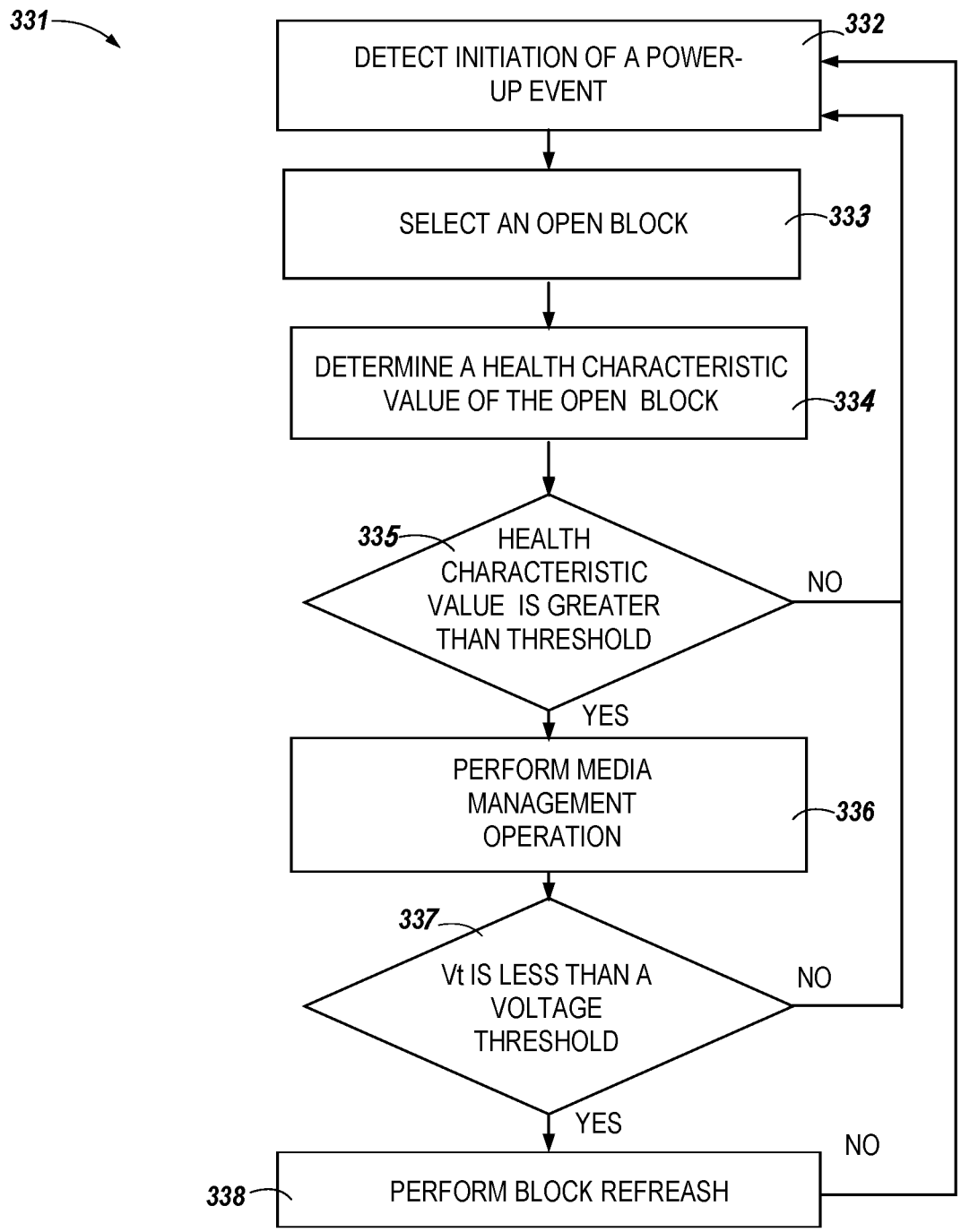
FIG. 3 is a flow diagram corresponding to media management on power-up in accordance with some embodiments of the present disclosure.

FIG. 3 is a diagram of a flow 331 corresponding to media management on power-up in accordance with some embodiments of the present disclosure. The flow 331 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow 331 is performed by the media management on power-up component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 332, a power-up event associated with a plurality of blocks of memory cells (e.g., NAND memory cells) can be detected. In some embodiments, a power-up event can be detected for some or all components of the memory sub-system (e.g., the memory sub-system 110 illustrated in FIG. 1, herein) by a media management on power-up component, such as the media management on power-up component 113 illustrated in FIG. 1.

At operation 333, an open block can be selected from one or more blocks (e.g., including closed blocks and at least one open block). For instance, an open virtual block can be selected from one or more of virtual blocks. The block can be selected responsive to detection of the power-up event at 332. For instance, responsive to detecting the power-up event, an open virtual block can be selected from one or more virtual blocks (e.g., open/closed virtual blocks) associated with respective blocks of NAND memory cells of a memory device, such as the memory device 140 illustrated in FIG. 1.

At operation 334, a threshold health characteristic value of the block, as selected at 333, can be determined. As mentioned, the threshold health characteristic value can be determined by determining at least one of a program-erase cycle (PEC) count, an erase count, an age, or any combination thereof, of the respective block of memory cells associated with the open virtual block. For instance, in some examples, the threshold health characteristic value can be determined by determination of a PEC count. As used herein, the "PEC count" generally refers to the number of times a NAND block has been accessed (e.g., programmed and/or erased), which is an indicator of block wear. For instance, PEC count of a respective block of NAND memory cells associated with the open virtual block can be determined, among other possibilities.

At operation 335, the threshold health characteristic value can be compared to a health threshold to permit determination of whether the threshold health characteristic value is greater than the health threshold. For instance, a PEC count can be compared to a PEC threshold to permit determination of whether the PEC count is greater than a PEC threshold. As used herein, a "PEC threshold" generally refers to a particular total number program-erase cycles. In some embodiments, the PEC threshold can be equal to 500, 1000, 1500, 2000, 3000, 4000, or 5000 program-erase cycles, among other possible types of health thresholds/values. In some embodiments, the PEC count can be a value that is incremented in a table such as look-up table or is otherwise stored or accessible to the memory sub-system.

If the open block has a threshold heath characteristic value (e.g., PEC count) that is less than or equal to the health threshold (e.g., a PEC threshold), the flow 331 can return to operation 332 and initiation of power-up events can continue to be detected. That is, the flow 331 can, in response to determining the PEC count is less than the PEC threshold, refrain from performing (i.e., not perform) a media management operation. Refraining from performing a media management operation can lower a computational burden on the memory sub-system and/or permit the media management operation to otherwise be performed at a different time (e.g., later as a background media management operation).

If, however, it is determined that the health characteristic value of the open block is greater than the health characteristic threshold, at operation 334, then the flow 331 can proceed to operation 336. At operation 336, a media management operation can be performed. For instance, based on the PEC count being greater than the PEC threshold (as determined at 335), a media management operation can be performed on a block of memory cells (e.g., NAND memory cells) of an open block associated with open virtual block.

In some embodiments, the media management operation can be performed responsive to detection of initiation of power-up event and prior to completion of the power-up event. In this manner, the media management operation (e.g., a scan operation) can be performed, and when needed (e.g., when a $V_T$ level is less than a $V_T$ threshold) a block refresh can be performed prior to completion of the power-up event. In any case, the media management operation can be performed responsive to detection of initiation of power-up event and prior to performing any host access of the open block following a power-off event. Stated differently, the media management operation can be performed in the absence of performance of an I/O transaction encumbering the host. As such, the flow 331 precludes open blocks from being programmed by the host system when the open block exhibits greater than a threshold health characteristic value and/or have experienced a power-off event, prior to being scanned and when needed, having a block refresh performed on the open block. Thus, the flow 331 can prevent occurrence of misplacement errors.

In some embodiments, performing the media management operation can include performing a read operation (e.g., at a different voltage than an erase voltage or a programming voltage) on a block to determine a $V_T$ level of the memory cell. Thus, at operation 337, the $V_T$ level (as determined via a media management operation at 336) can be compared to a $V_T$ threshold to permit determination of whether the $V_T$ level is less than the $V_T$ threshold. If the $V_T$ level is greater than or equal to the $V_T$ threshold, the flow 331 can return to operation 332 and initiation of power-up events can continue to be determined. If, however, it is determined that the $V_T$ level is less than the $V_T$ threshold then the flow 331 can proceed to operation 338.

At operation 338, a block refresh can be performed. For instance, in some embodiments, a block refresh can be performed on a respective block of NAND memory cells associated with an open block responsive to performing the media management operation, at 336, and/or responsive to a determination that the $V_T$ level is less than the $V_T$ threshold, at 337. As used herein, a block refresh generally refers to the copying of data from one portion of a NAND device to another, such as copying data written to one block of memory cells to another block of memory cells. In some embodiments, the block refresh can be part of a media management operation such as a garbage collection operation, as described above. Subsequent to performance of the block refresh, the flow 331 can return to operation 332.

In some embodiments, a closed virtual block can be identified from one or more virtual blocks responsive to determination of an occurrence of initiation of a power-up event. For instance, a closed virtual block can be identified responsive to determining the occurrence of the initiation of the power-up event and prior to receipt of signaling indicative of a host initiation sequence. Responsive to identification of the closed virtual block, the flow 331 can refrain from performance of a media management operation on the closed virtual block. For instance, the flow 331 can refrain from performance of the media management operation on the closed virtual block, and instead, can identify additional virtual blocks until determining that a block of memory cells associated with a respective block among the blocks is an open virtual block. Refraining from performance of the media management operation on a closed virtual block can reduce an amount of computational overhead and/or an amount of bus traffic associated with the media management operations on power-up, as detailed herein.

Figure 4:
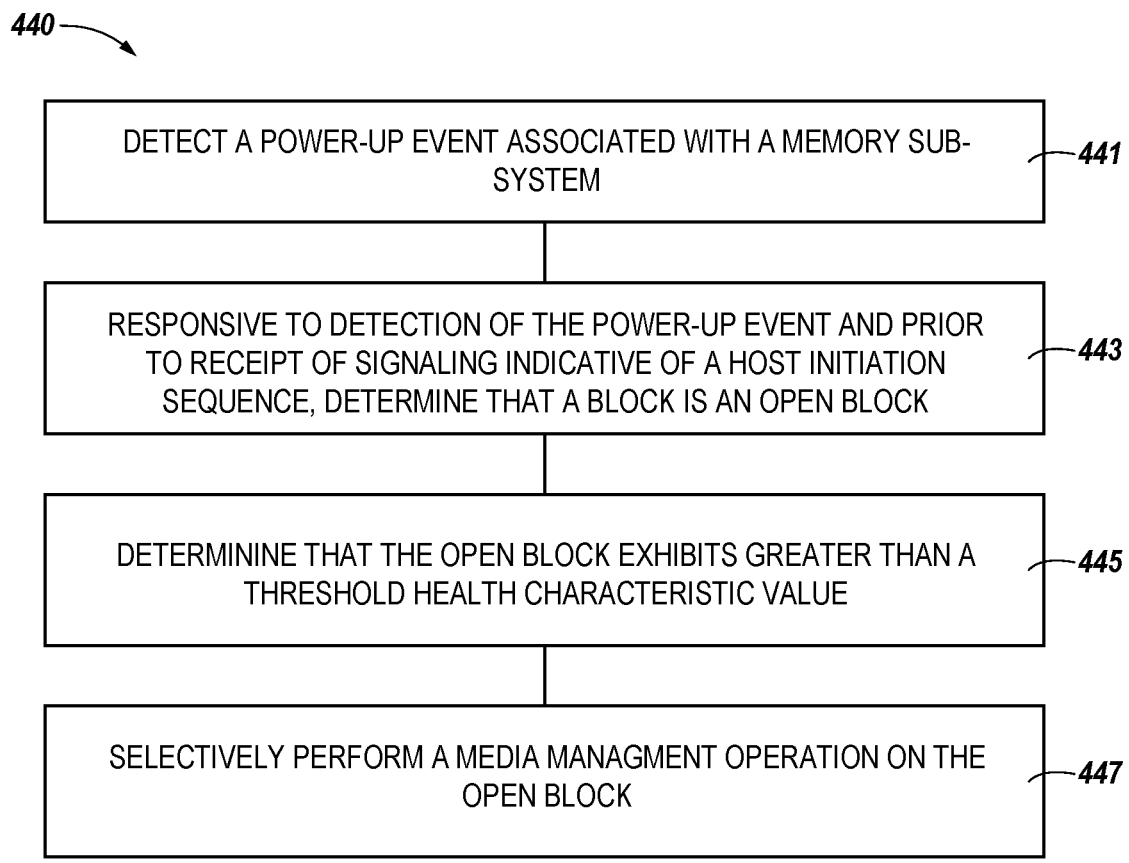
FIG. 4 is a flow diagram corresponding to a method for media management on power-up in accordance with some embodiments of the present disclosure.

FIG. 4 is flow diagram corresponding to a method 440 for media management on power-up in accordance with some embodiments of the present disclosure. The method 440 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 440 is performed by the media management on power-up component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 441, a power-up event associated with a memory sub-system can be detected. For instance, a power-up event associated with a memory sub-system including blocks (e.g., physical and/or logical blocks of memory cells) which have another block (e.g., a virtual block) associated therewith can be detected. In some embodiments, the memory sub-system can be analogous to the memory sub-system 110 illustrated in FIG. 1. As described above, the memory components can be memory dice or memory packages that are coupled to one another to create an array of memory cells, such as a three-dimensional stackable crossgridded array of memory cells used by the memory sub-system to store data.

At operation 443, an open block can be determined responsive to detecting the power-up event. The open block can be determined responsive to detecting the power-up event and prior to receipt of signaling indicative of a host initiation sequence. For example, the method 440 can include performing a read/scan operation to identify whether the block is an open or closed block. In some embodiments, a read voltage can be applied to a page or pages of the block, among other possibilities.

In some embodiments, a determination can be made that a block associated with a respective block among the plurality of blocks is an open virtual block. For instance, at operation 443, a determination can be made that a block associated with a respective block among the blocks of memory cells is an open virtual block responsive to determining the power-up event and prior to receipt of signaling indicative of a host initiation sequence.

At operation 445, the method 440 can include determining that an open block exhibits greater than a threshold health characteristic value. For instance, a health characteristic value of the open block can be determined, as detailed herein, and subsequent determination can be made whether or not the determined health characteristic value is greater than a health threshold, as detailed herein.

At operation 447, the method 440 can include selective performance of a media management operation on the open block, as detailed herein. For instance, the method 440 can include selectively performing a media management operation on a respective block associated with the open virtual block in response to the determination that the respective block exhibits greater than the threshold health characteristic value.

Figure 5:
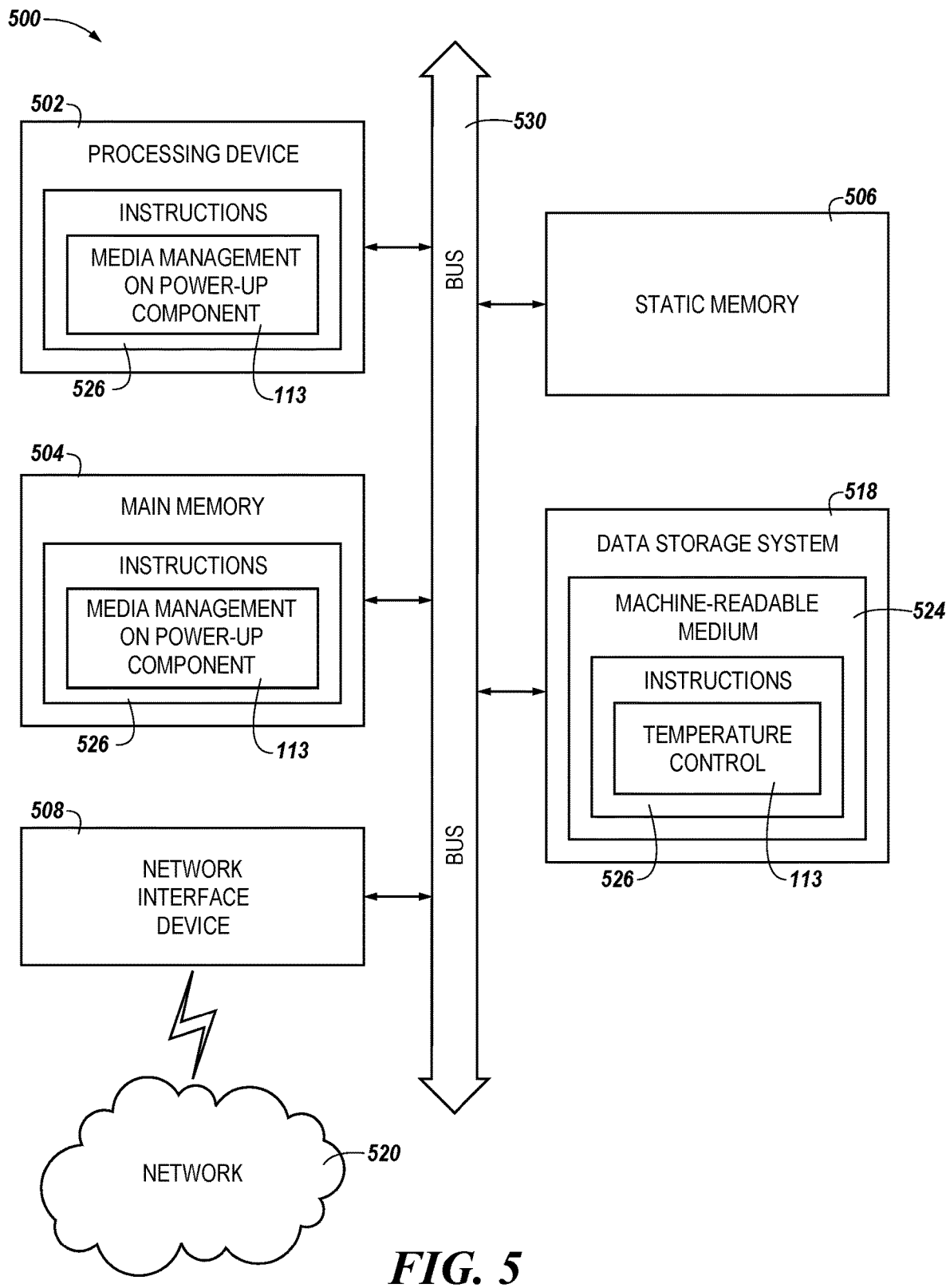
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media management on power-up component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a media management on power-up component (e.g., the media management on power-up component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    detecting an occurrence of a power-up event associated with a memory sub-system comprising a plurality of blocks of memory cells having blocks of virtual memory cells associated therewith;
    responsive to detection of the occurrence of the power-up event and prior to a host utilizing an interface associated with the memory sub-system, determining that a block of memory cells associated with a respective block among the plurality of blocks of memory cells is an open virtual block of memory cells;
    determining that the respective block associated with the open virtual block of memory cells exhibits greater than a threshold health characteristic value; and
    selectively performing a media management operation on the respective block of memory cells associated with the open virtual block of memory cells in response to the determination that the respective block associated with the open virtual block of memory cells exhibits greater than the threshold health characteristic value.

2. The method of claim 1, further comprising performing a block refresh of data stored in the respective block of memory cells associated with the open virtual block of memory cells.

3. The method of claim 2, further comprising performing the block refresh prior to performing any host accesses of the plurality of blocks of memory cells.

4. The method of claim 1, wherein determining that the respective block associated with the open virtual block of memory cells exhibits greater than a threshold health characteristic value further comprises determining a program-erase cycle (PEC) count of the respective block of memory cells associated with the open virtual block of memory cells.

5. The method of claim 4, further comprising comparing the PEC count to a PEC threshold.

6. The method of claim 5, wherein selectively performing the media management operation further comprises:
    determining the PEC count is less than the PEC threshold; and
    in response to determining the PEC count is less than the PEC threshold, refraining from performing the media management operation.

7. The method of claim 5, wherein selectively performing the media management operation further comprises:
    determining that the PEC count is greater than the PEC threshold; and
    in response to determining that the PEC count is greater than the PEC threshold, performing the media management operation.

8. The method of claim 1, wherein respective blocks of memory cells are grouped into a plurality of pages, and wherein some but not all pages have data stored in the pages.

9. The method of claim 8, wherein the data is stored in at least a lower page of the plurality of pages.

10. An apparatus, comprising:
    a media management on power-up component configured to:
        detect initiation of a power-up event associated with a plurality of blocks of NAND memory cells;
        responsive to detecting the power-up event and prior to a host utilizing an interface associated with plurality of blocks of NAND memory cells, select an open virtual block from a plurality of virtual blocks associated with respective blocks of the plurality of blocks of NAND memory cells;
        determine a program-erase cycle (PEC) count of a respective block of NAND memory cells associated with the open virtual block;
        compare the PEC count to a PEC threshold;
        determine the PEC count is greater than the PEC threshold; and
        based on the PEC count being greater than the PEC threshold, perform a media management operation involving at least one of the respective blocks of the plurality of NAND memory cells associated with the open virtual block.

11. The apparatus of claim 10, wherein the media management on power-up component is further configured to perform the media management operation prior to completion of the power-up event.

12. The apparatus of claim 10, wherein the media management on power-up component is further configured to identify a closed virtual block from the plurality of virtual blocks responsive to detection of the power-up event.

13. The apparatus of claim 12, wherein the media management on power-up component is further configured to refrain from performance of a media management operation involving the closed virtual block.

14. The apparatus of claim 12, wherein the media management on power-up component is further configured to perform a block refresh on the respective block of NAND memory cells associated with the open virtual block responsive to performing the media management operation on the open virtual block.

15. A system, comprising:
a memory sub-system comprising a plurality of memory components arranged to form a stackable cross-gridded array of a plurality of blocks of interleaved NAND memory cells; and
a processing device coupled to the plurality of memory components, the processing device to perform operations comprising:
- detecting initiation of a power-up event associated with the plurality of blocks of interleaved NAND memory cells;
- responsive to detecting the power-up event and prior to a host utilizing an interface associated with the memory sub-system, selecting an open virtual block from a plurality of virtual blocks associated with respective blocks of NAND memory cells of the plurality of blocks of NAND memory cells;
- determine a program-erase cycle (PEC) count of a respective block of NAND memory cells associated with the open virtual block;
- determine the PEC count is greater than a PEC threshold;
- based on the PEC count being greater than the PEC threshold, performing a media management operation on the respective block of NAND memory cells associated with the open virtual block; and
- based on performing a media management operation on the respective block of NAND memory cells associated with the open virtual block, performing a block refresh of the respective block of NAND memory cells associated with the open virtual block.

16. The system of claim 15, further comprising determining that the virtual block of memory cells is the open virtual block of memory cells by determining that a lower page associated with the virtual block is programmed and an upper page associated with the virtual block of memory cells is an open page.

17. The system of claim 15, wherein the PEC threshold is equal to 500, 1000, 1500, 2000, 3000, 4000, or 5000 program-erase cycles.

18. The system of claim 15, wherein performing the media management operation further comprises performing a read operation on the respective block of NAND memory cells associated with the open virtual block.

19. The system of claim 18, further comprises determining a threshold voltage ($V_T$) level of the respective block of NAND memory cells associated with the open virtual block by performing the read operation.

20. The system of claim 19, further comprising:
- determining the $V_T$ level of the respective block of NAND memory cells is less than a voltage threshold; and
- based on determining the $V_T$ level of the respective block of NAND memory cells is less than the voltage threshold, performing the block refresh on the respective block of NAND memory cells associated with the open virtual block.

* * * * *